(12) United States Patent
Seo et al.

(10) Patent No.: US 7,106,150 B2
(45) Date of Patent: Sep. 12, 2006

(54) SURFACE ACOUSTIC WAVE FILTER

(75) Inventors: Koji Seo, Katano (JP); Tetsuro Shimamura, Kyoto (JP); Toru Sakuragawa, Shijonawate (JP); Hiroshi Kushanti, Izumisano (JP); Yuki Satoh, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 82 days.

(21) Appl. No.: 10/940,577

(22) Filed: Sep. 14, 2004

(65) Prior Publication Data

US 2005/0062559 A1    Mar. 24, 2005

(30) Foreign Application Priority Data

Sep. 19, 2003   (JP) .............................. 2003-327791

(51) Int. Cl.
*H03H 9/00* (2006.01)
*H01L 41/047* (2006.01)

(52) U.S. Cl. .................. 333/193; 333/194; 310/313 R; 310/348

(58) Field of Classification Search ................ 333/133, 333/193, 194; 310/313 B, 313 D, 313 R, 310/348; 361/719
See application file for complete search history.

(56) References Cited

U.S. PATENT DOCUMENTS

| | | | | |
|---|---|---|---|---|
| 6,034,578 A | * | 3/2000 | Fujita et al. | 333/193 |
| 6,150,904 A | * | 11/2000 | Taniguchi et al. | 333/193 |
| 6,480,077 B1 | * | 11/2002 | Ohashi | 333/193 |
| 6,879,488 B1 | * | 4/2005 | Takeda et al. | 361/704 |

FOREIGN PATENT DOCUMENTS

JP    06-164309    6/1994

* cited by examiner

*Primary Examiner*—Dean Takaoka
(74) *Attorney, Agent, or Firm*—RatnerPrestia

(57) ABSTRACT

A surface acoustic wave filter with little electromagnetic coupling between wires and improved attenuation characteristics is provided. This surface acoustic wave filter comprises: a package having a concavity in the shape of stairs made by laminating dielectrics, a surface acoustic wave element provided on the bottom face of the concavity, a plurality of wires for connecting between a plurality of electrodes provided on the surface of the surface acoustic wave element and a plurality of electrodes provided on one same plane portion of the stairs of the package in correspondence to a plurality of electrodes, and a dummy wire provided between the wires.

4 Claims, 4 Drawing Sheets

SURFACE ACOUSTIC WAVE FILTER

FIELD OF THE INVENTION

The present invention concerns a surface acoustic wave filter available for use in antenna duplex apparatus in compact mobile communication equipment such as portable phone, etc.

BACKGROUND OF THE INVENTION

There is a growing demand, in recent years, for antenna duplexers constructed by combining transmission filter and receiving filter which are component parts of portable phone. And features of compact size and high performances are required of antenna duplexers.

FIG. 6 indicates a conventional surface acoustic wave filter. The surface acoustic wave filter indicated in FIG. 6 is constructed by having surface acoustic wave resonators R1, R2 connected in series and surface acoustic wave resonators R3, R4 grounded through bonding wires 114, 115.

As such surface acoustic wave filter is known Japanese Laid-Open Patent Application No. H6-164309, for example.

SUMMARY OF THE INVENTION

A surface acoustic wave filter comprises:

a package having a concavity in the shape of stairs made by laminating at least no less than one dielectric, a surface acoustic wave element provided on the bottom face of the concavity, a plurality of wires for connecting between a plurality of electrodes provided on the surface of the surface acoustic wave element, and a plurality of electrodes provided on one same plane portion of the stairs of the package in correspondence to the plurality of electrodes, and a dummy wire provided between the wires.

DETAILED DESCRIPTION OF THE EXEMPLARY EMBODIMENTS

However, with the above-described conventional construction, there is a problem that the coupling of electromagnetic field between wires becomes non-negligible as the frequency used gets higher, causing deterioration of the amount of attenuation in the blocking range of a surface acoustic wave filter.

The objective of the present invention is to improve attenuation characteristics of surface acoustic wave filter.

(Exemplary Embodiment 1)

Explanation will be made below on the present invention, by using the exemplary embodiment 1.

Figure 1:
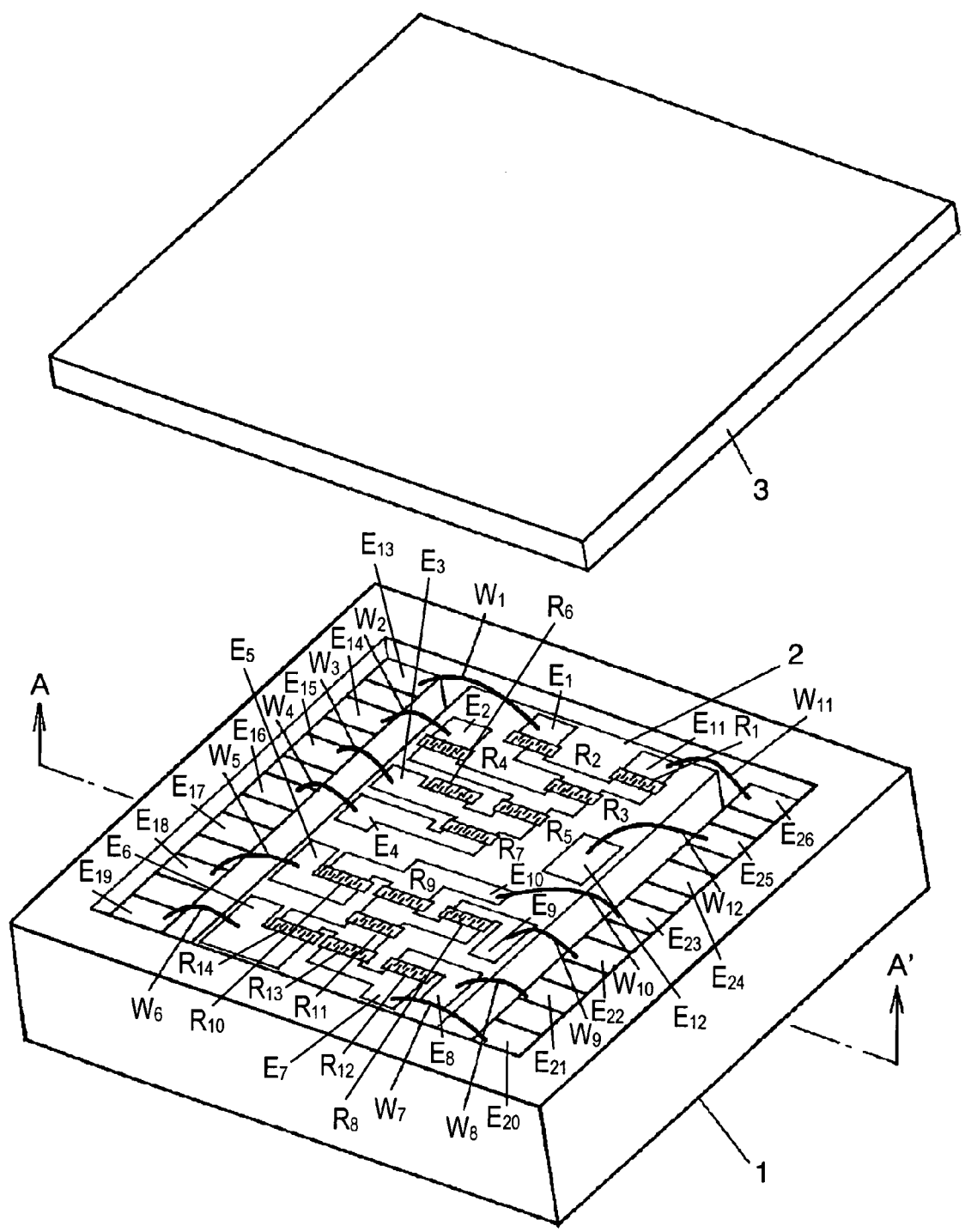
FIG. 1 is an exploded perspective view of the surface acoustic wave filter in the exemplary embodiment of the present invention.
Figure 2:
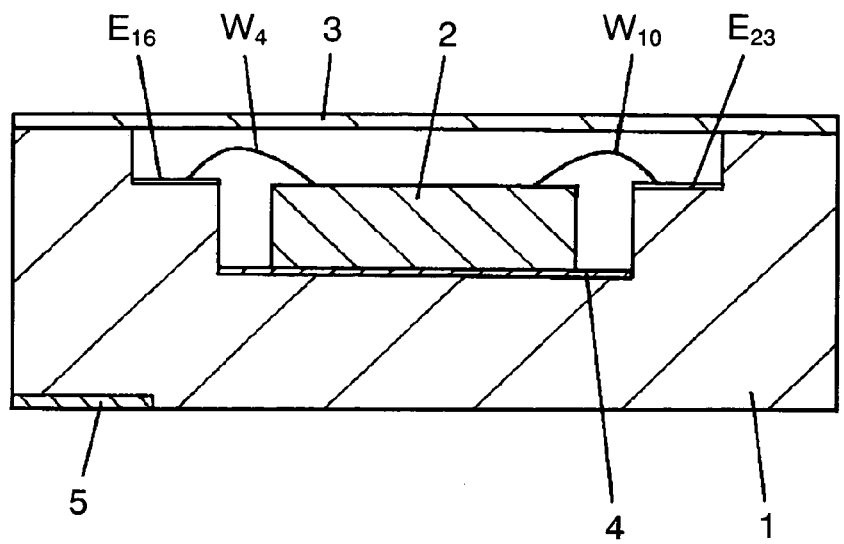
FIG. 2 is a sectional view of the surface acoustic wave filter in the exemplary embodiment of the present invention.

FIG. 1 is a perspective view of the surface acoustic wave filter in the exemplary embodiment 1 of the present invention, while FIG. 2 is a sectional view of the surface acoustic wave filter in the same exemplary embodiment. In FIG. 1 and FIG. 2, the same objects are expressed with same reference numerals.

In FIG. 1, at the stairs of the concavity of package 1 are provided electrodes E13–E26, and at the bottom face of the concavity of package 1 is provided surface acoustic wave element 2. On the surface of surface acoustic wave element 2 are constructed a surface acoustic wave filter for transmission and a surface acoustic wave filter for reception. The surface acoustic wave filter for transmission is composed of serial resonators R1, R3, R5, R7 and parallel resonators R2, R4, R6. The surface acoustic wave filter for reception is composed of serial resonators R9, R11, R13 and parallel resonators R8, R10, R12, R14. The surface acoustic wave filter for transmission and the surface acoustic wave filter for reception are provided with electrodes E1~E12, which are connected to the respective corresponding electrodes E13~E26 on package 1 side by means of wires W1~W12.

Electrode E12 on surface acoustic wave element 2 is not connected with other electrodes on surface acoustic wave element 2. Electrode E12 is connected with electrode E25 at the stairs of the concavity of package 1 by means of wire W12. This wire W12 is called dummy wire. Thanks to the existence of dummy wire W12, mutual inductance between wires W10 and W11, that sandwich wire W12, can be reduced, for example.

Moreover, electrodes E17 and E24 at the stairs of the concavity of package 1 are constructed in a way not to be connected with any wire, and such electrodes are called dummy electrodes. A dummy electrode is an electrode not connected with any electrode on surface acoustic wave element 2. Since electrodes have some inductance component in the same way as wires, there exists mutual inductance between electrodes. However, because of the existence of dummy electrode E17 for example, the mutual inductance between electrodes E16 and E18 across E17 can be reduced. The same is true also about dummy electrode E24, and the mutual inductance between electrodes E23 and E25 can be reduced.

FIG. 2 is a sectional view of the surface acoustic wave filter indicated in FIG. 1.

In FIG. 2, at the bottom face of the concavity in the shape of stairs of package 1 is provided surface acoustic wave element 2, and sealed with lid 3. At the bottom face of the concavity of package 1 is provided ground electrode 4. On the back face of package 1 is provided antenna terminal 5. And, electrodes provided on the surface of surface acoustic wave element 2 and electrodes E16 and E23 provided at the stairs of package 1 are connected to each other by means of wires W4, W10.

Figure 3:
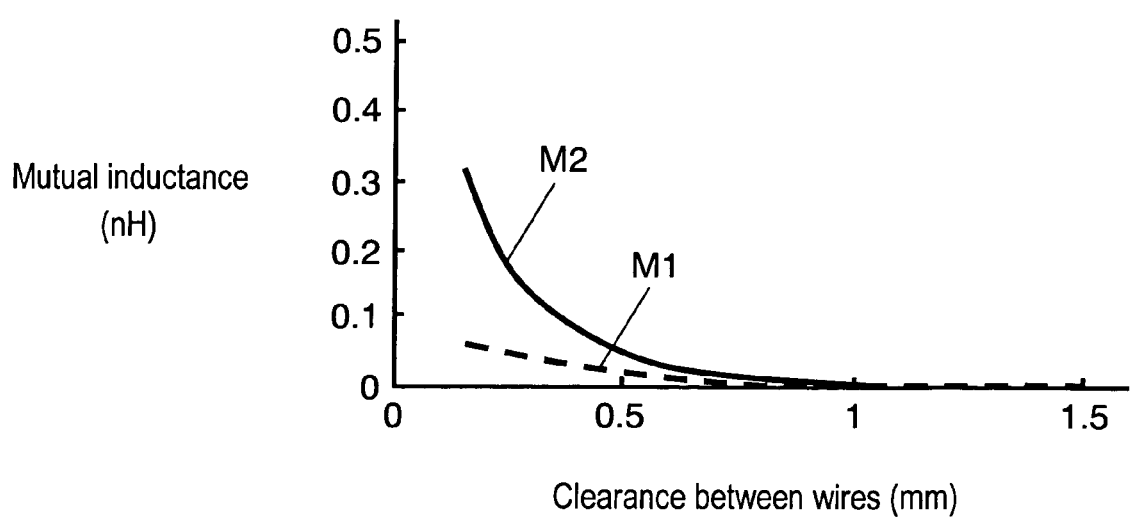
FIG. 3 is a graph of wires and mutual inductance.

FIG. 3 is a graph showing mutual inductance between two wires sandwiching dummy wire by means of electromagnetic field simulation in the case with dummy wire of the present invention, and a case without such dummy wire.

The model of simulation is a rectangular parallelopipedic conductor with a height of 0.5 mm grounded at all of its 6 faces in which are provided two wires with a diameter of 35 μm and a length of 1 mm in parallel at a height of 0.25 mm from the bottom face of the rectangular parallelopiped. In this state, mutual inductance between the wires is determined by changing the distance between these two wires from 0.15 to 1.5 mm.

The axis of ordinate indicates the value of mutual inductance, while the axis of abscissa shows the clearance between wires. The solid line M2 indicates the mutual inductance between two parallel wires, and broken line M1 indicates mutual inductance in the case where a wire of ground potential exists between the two parallel wires.

As shown in this graph, at a distance between two wires of 0.5 mm, the mutual inductance is 0.01 nH in the case where a wire of ground potential exists. On the other hand, in the case without any wire of ground potential, the mutual inductance comes to 0.05 nH. Namely, it shows that, by providing a wire of ground potential between two parallel wires, it becomes possible to reduce the mutual inductance, and especially that the shorter the distance between two parallel wires, the larger that effect.

(Exemplary Embodiment 2)

Explanation will be given below on the exemplary embodiment 2.

Figure 4:
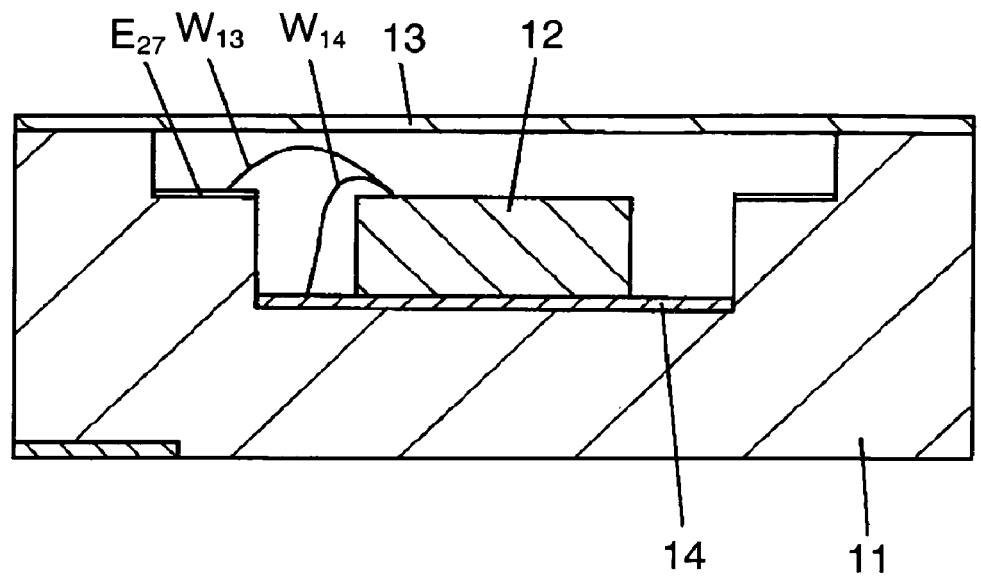
FIG. 4 is a sectional view of the surface acoustic wave filter in the exemplary embodiment of the present invention.

FIG. 4 is a sectional view of the surface acoustic wave filter in the exemplary embodiment 2 of the present invention.

In FIG. 4, at the bottom face of the concavity in the shape of stairs of package 11 is provided surface acoustic wave element 12, and sealed with lid 13. At the bottom face of the stairs of concavity of package 11 is provided ground electrode 14.

The electrode provided on the surface of surface acoustic wave element 12 and electrode E27 provided at the stairs of package 11 are connected to each other by means of wire W13. Moreover, the electrode provided on the surface of surface acoustic wave element 12 and ground electrode 14 on package 11 are connected to each other by means of wire W14 adjoining wire W13. This makes it possible to expand the relative distance between wires, compared with the case where adjoining wires W13, W14 are connected to the electrode provided on one same plane with the stairs of package 11. Therefore, it becomes possible to reduce the mutual inductance between adjoining wires W13 and W14.

(Exemplary Embodiment 3)

Explanation will be given below on the exemplary embodiment 3.

Figure 5:
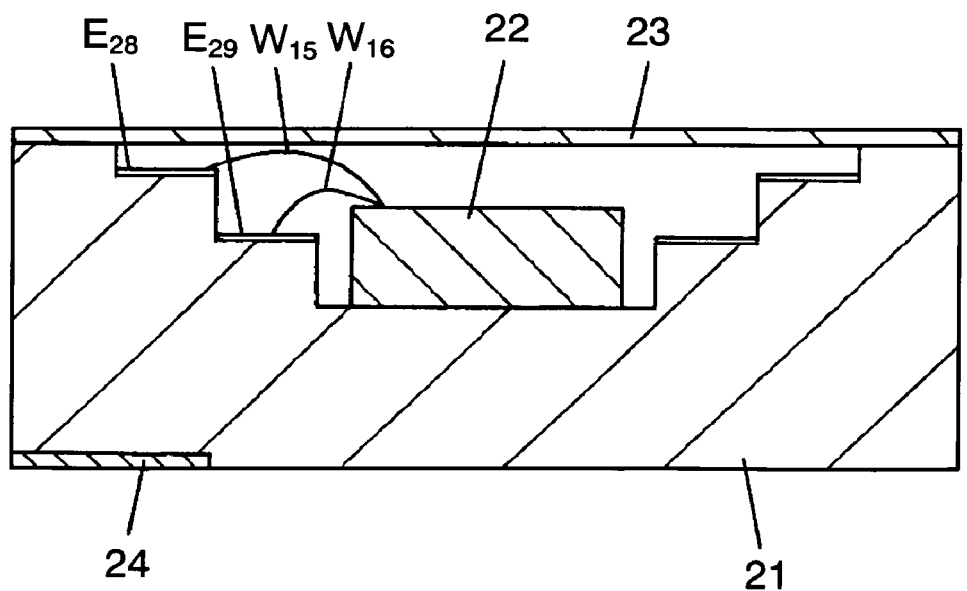
FIG. 5 is a sectional view of the surface acoustic wave filter in the exemplary embodiment of the present invention.
Figure 6:
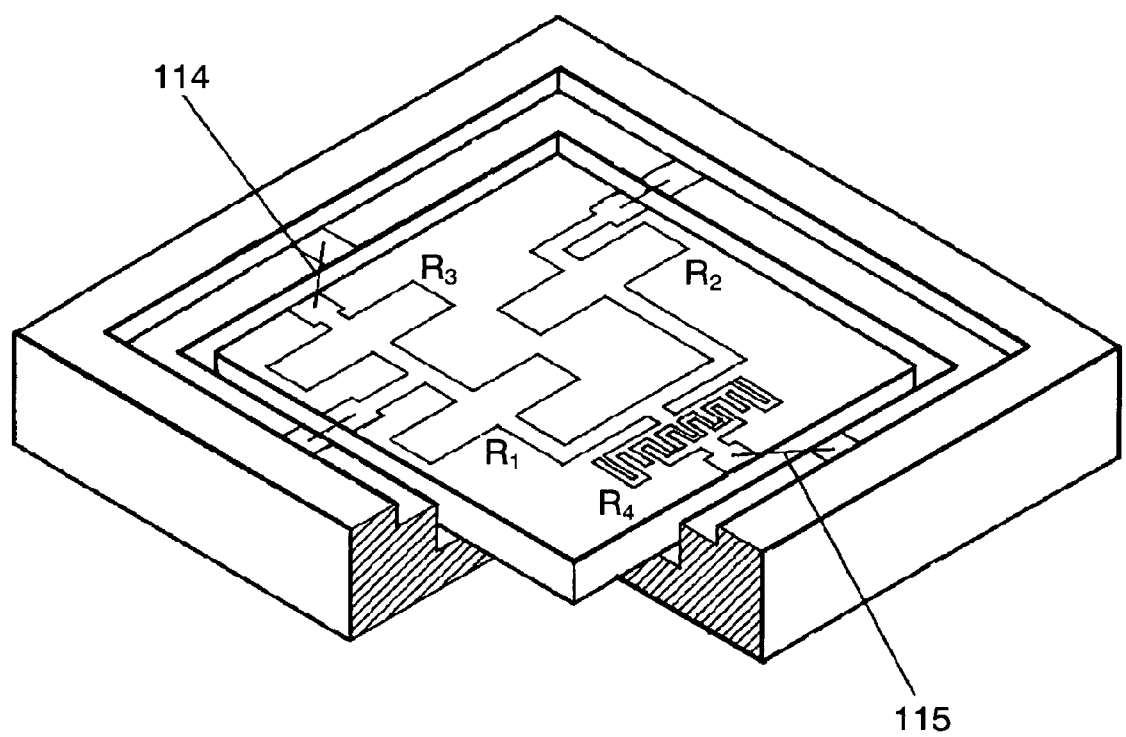
FIG. 6 is a partially notched perspective view of a conventional surface acoustic wave filter.

FIG. 5 is a sectional view of the surface acoustic wave filter in the exemplary embodiment 3 of the present invention.

In FIG. 5, at the bottom face of the concavity of package 21 is provided surface acoustic wave element 22, and sealed with lid 23. On the back face of package 21 is provided terminal 24.

The electrode provided on the surface of surface acoustic wave element 22 and electrode E28 provided on the plane of the stairs of package 21 are connected to each other by means of wires W15. Moreover, the electrode on the surface acoustic wave element 22 is connected with electrode E29 provided on a plane different from that of electrode E28 at the stairs of package 21 by means of wires W16 adjoining wire W15. This makes it possible to expand the relative distance between wires, compared with the case where the adjoining wires are connected to the electrodes provided on one same plane with the stairs of package 21. Therefore, it becomes possible to reduce the mutual inductance between the adjoining wires.

As explained above, the present invention indicates a surface acoustic wave filter comprising:

a package having a concavity in the shape of stairs made by laminating at least no less than one dielectric, a surface acoustic wave element provided on the bottom face of the concavity of this package, a plurality of wires for connecting between a plurality of electrodes provided on the surface of the surface acoustic wave element, and a plurality of electrodes provided on one same plane portion of the stairs of the package in correspondence to the plurality of electrodes, and a wire connected to either a ground electrode or an electrode not electrically connected to other electrodes disposed between those plurality of wires. This configuration provides an advantage of enabling to improve attenuation characteristics of surface acoustic wave filter, by reducing electromagnetic coupling between wires.

Moreover, the present invention also indicates a surface acoustic wave filter as described above, wherein a plurality of adjoining wires are connected with electrodes provided on different planes of stairs of the concavity of the package. This enables to reduce the electromagnetic coupling between wires, and improve attenuation characteristics of surface acoustic wave filter.

Furthermore, the present invention also indicates a surface acoustic wave filter comprising:

a plurality of wires for connecting between a plurality of electrodes provided on the surface of the surface acoustic wave element, and a plurality of electrodes provided on one same plane portion of the stairs of the package in correspondence to the plurality of electrodes, and at least one wire connected to either a ground electrode or an electrode not electrically connected to other electrodes disposed between those plurality of wires. This enables to reduce electromagnetic coupling between wires, and improve attenuation characteristics of surface acoustic wave filter.

Still more, the present invention also indicates a surface acoustic wave filter, constructed by connecting a plurality of electrodes provided on the surface of the surface acoustic wave element, and a plurality of electrodes provided on one same plane portion of the stairs of the package in correspondence to a plurality of electrodes to each other, by means of wire bonding, and disposing at least one dummy electrode not wire bonded between the plurality of electrodes of the package. This enables to reduce electromagnetic coupling between wires, and improve attenuation characteristics of surface acoustic wave filter.

As explained above, the surface acoustic wave filter according to the present invention provides an advantage of enabling to reduce mutual inductance between wires and improve attenuation characteristics of surface acoustic wave filter, and is useful for antenna duplexer in compact mobile communication equipment such as portable phone, etc.

What is claimed is:

1. A surface acoustic wave filter comprising:
   a package having a concavity in the shape of stairs made by laminating at least no less than one dielectric;
   a surface acoustic wave element provided on the bottom face of the concavity;
   a plurality of wires for connecting between a plurality of electrodes provided on the surface of the surface acoustic wave element, and a plurality of electrodes provided on one same plane portion of the stairs of the package in correspondence to a plurality of electrodes; and
   a dummy wire provided between the wires.

2. A surface acoustic wave filter as defined in claim 1, wherein the dummy wire is provided between the wires, and connected to either a ground electrode or an electrode not electrically connected to other electrodes disposed between the wires.

3. A surface acoustic wave filter as defined in claim 2, wherein a plurality of adjoining wires are connected with electrodes provided on different planes of stairs of the concavity.

4. A surface acoustic wave filter as defined in claim 1, further comprising at least one dummy electrode not wire bonded and disposed between the plurality of electrodes of the package,
   wherein a plurality of electrodes provided on the surface of the surface acoustic wave element and a plurality of electrodes provided on one same plane portion of the stairs of the package in correspondence to the plurality of electrodes to each other are connected by means of wire bonding.

* * * * *

UNITED STATES PATENT AND TRADEMARK OFFICE
CERTIFICATE OF CORRECTION

PATENT NO.       : 7,106,150 B2
APPLICATION NO.  : 10/940577
DATED            : September 12, 2006
INVENTOR(S)      : Koji Seo et al.

It is certified that error appears in the above-identified patent and that said Letters Patent is hereby corrected as shown below:

Title Page, Field (75) INVENTORS

"Hiroshi Kushanti" should read -- Hiroshi Kushitani --

Signed and Sealed this

Tenth Day of April, 2007

JON W. DUDAS
*Director of the United States Patent and Trademark Office*